United States Patent [19]

Kirkman et al.

[11] 4,351,580

[45] Sep. 28, 1982

[54] CARRIER SOCKET FOR LEADLESS INTEGRATED CIRCUIT DEVICES

[75] Inventors: Michael Kirkman, Swansea; Frank C. Rydwansky, Jr., Quincy; Richard J. Hanlon, Attleboro; Richard W. Petersen, Taunton, all of Mass.

[73] Assignee: Augat Inc., Attleboro, Mass.

[21] Appl. No.: 150,047

[22] Filed: May 15, 1980

[51] Int. Cl.³ .......................................... H01R 23/72
[52] U.S. Cl. ........................... 339/17 CF; 174/52 FP; 339/75 MP
[58] Field of Search ......... 339/17 CF, 75 MP, 220 R, 339/221 R, 174; 174/52 FP

[56] References Cited

U.S. PATENT DOCUMENTS

| | | |
|---|---|---|
| 3,771,109 | 11/1973 | Bruckner et al. |
| 3,846,737 | 11/1974 | Spaulding |
| 3,877,064 | 4/1975 | Scheingold et al. |
| 3,904,262 | 9/1975 | Cutchaw |
| 3,910,664 | 10/1975 | Pauza et al. |
| 3,940,786 | 2/1976 | Scheingold et al. |
| 3,951,495 | 4/1976 | Donaher et al. |
| 3,953,101 | 4/1976 | Palecek |
| 3,982,159 | 9/1976 | Dennis et al. |
| 3,993,384 | 11/1976 | Dennis et al. |
| 3,998,512 | 12/1976 | Anhalt et al. |
| 4,018,494 | 4/1977 | Scheingold et al. |
| 4,045,105 | 8/1977 | Lee et al. |
| 4,063,791 | 12/1977 | Cutchaw |
| 4,089,575 | 5/1978 | Grabbe |
| 4,130,327 | 12/1978 | Spaulding |
| 4,144,648 | 3/1979 | Govender |
| 4,155,615 | 5/1979 | Zimmerman, Jr. et al. |
| 4,220,383 | 9/1980 | Scheingold et al. .......... 339/17 CF |
| 4,221,448 | 9/1980 | Logerot et al. .............. 339/75 MP |

*Primary Examiner*—Mark Rosenbaum
*Attorney, Agent, or Firm*—Weingarten, Schurgin & Gagnebin

[57] ABSTRACT

A carrier socket for leadless chip integrated circuit devices. A flat leadless substrate with a circuit chip thereon is positioned within a housing having spring-loaded contacts mounted therein, each such contact adapted to engage a contact pad on the substrate. A resilient cover engages the housing and holds the substrate against the contacts in a positive manner. The contacts are formed to facilitate electrical connection between the integrated circuit chip and a circuit board. The contacts may be secured to the board by various means such as soldering or planar welding.

18 Claims, 7 Drawing Figures

CARRIER SOCKET FOR LEADLESS INTEGRATED CIRCUIT DEVICES

FIELD OF THE INVENTION

This invention relates generally to electronic interconnection devices and more particularly to a socket for connecting a leadless integrated circuit device to a circuit board.

DISCUSSION OF THE PRIOR ART

Integrated circuit (IC) devices, often referred to as "chips," are relatively fragile and are commonly mounted upon an insulator substrate, typically formed of ceramic material. The chip itself is very small and the substrate provides accessible means for connecting the chip leads to external circuitry. Permanent electrical connections are made between contact pads on the substrate and the chip itself. The substrate is typically formed as a thin, flat, rectangular or square device with the contact pads located around the periphery of the substrate on at least one flat surface thereof.

Many carrier sockets have been devised to provide interconnection between a leadless chip substrate and an external device such as a circuit board or a panel board. An example of such a device is disclosed in U.S. Pat. No. 4,130,327. The carrier socket of that patent has an insulative base member with a plurality of contact elements mounted in appropriately shaped openings in the base, the contacts being adapted to make surface contact with conductive pads on the chip carrier or substrate. A resilient cover provides a removable clamping means to hold the substrate within an appropriately shaped cavity in the base with the substrate pads in contact with the contact elements in the base.

A common problem with the prior art devices is that they are generally designed to enclose or surround the chip substrate, thereby employing circuit board real estate or area beyond the confines of the substrate. Significant efforts have been made over the years to reduce the size of electronic devices and the means by which these devices are interconnected with one another and to external circuitry so that devices such as insulator sockets are as close to the overall dimensions of the electronic circuit device as possible.

SUMMARY OF THE INVENTION

It is an object of this invention to provide a carrier socket for a leadless integrated circuit device which employs little or no circuit board area beyond the periphery of the substrate itself. Additionally, this device is simple to make, assemble and install on a circuit board, while at the same time providing very positive retention of the substrate in the socket with predictably positive contact between each of the contact elements and its corresponding contact pad on the substrate.

The base of this invention has exterior dimensions which are generally similar to the leadless chip substrate and includes a plurality of slots which receive specially configured contact elements in a positive manner. The base is formed with four corner posts which provide registration on the circuit board and proper polarity of the substrate mounted to the base. The dimensions of the exterior envelope, including the corners of the base, are substantially the same as the exterior dimensions of the substrate. A resilient cover element is clamped to the base and holds the substrate in place, providing positive contact between the conductive pads on the substrate and the resilient top portion of each contact element. The opposite end of each contact element makes connection to the circuit board, such as by contacting a pad on a circuit board for soldering or planar welding thereto, or it may extend into a hole in the circuit board for soldering.

No separate tools are necessary to assemble the substrate and the cover to the base and disassembly is easily accomplished when desired.

BRIEF DESCRIPTION OF THE DRAWING

The objects, advantages and features of this invention will be more readily perceived from the following detailed description when taken in conjunction with the accompanying drawing in which.

DETAILED DESCRIPTION OF THE PREFERRED EMBODIMENTS

Figure 1:
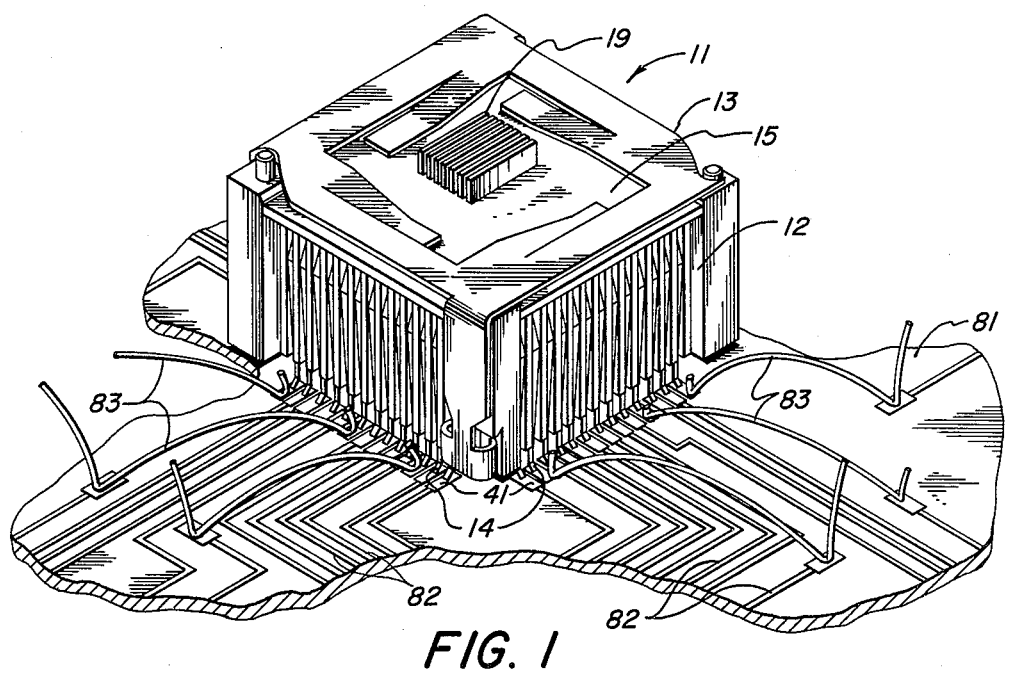
FIG. 1 is a perspective view of the carrier socket of this invention mounted to a circuit board and planar welded thereto.
Figure 4:
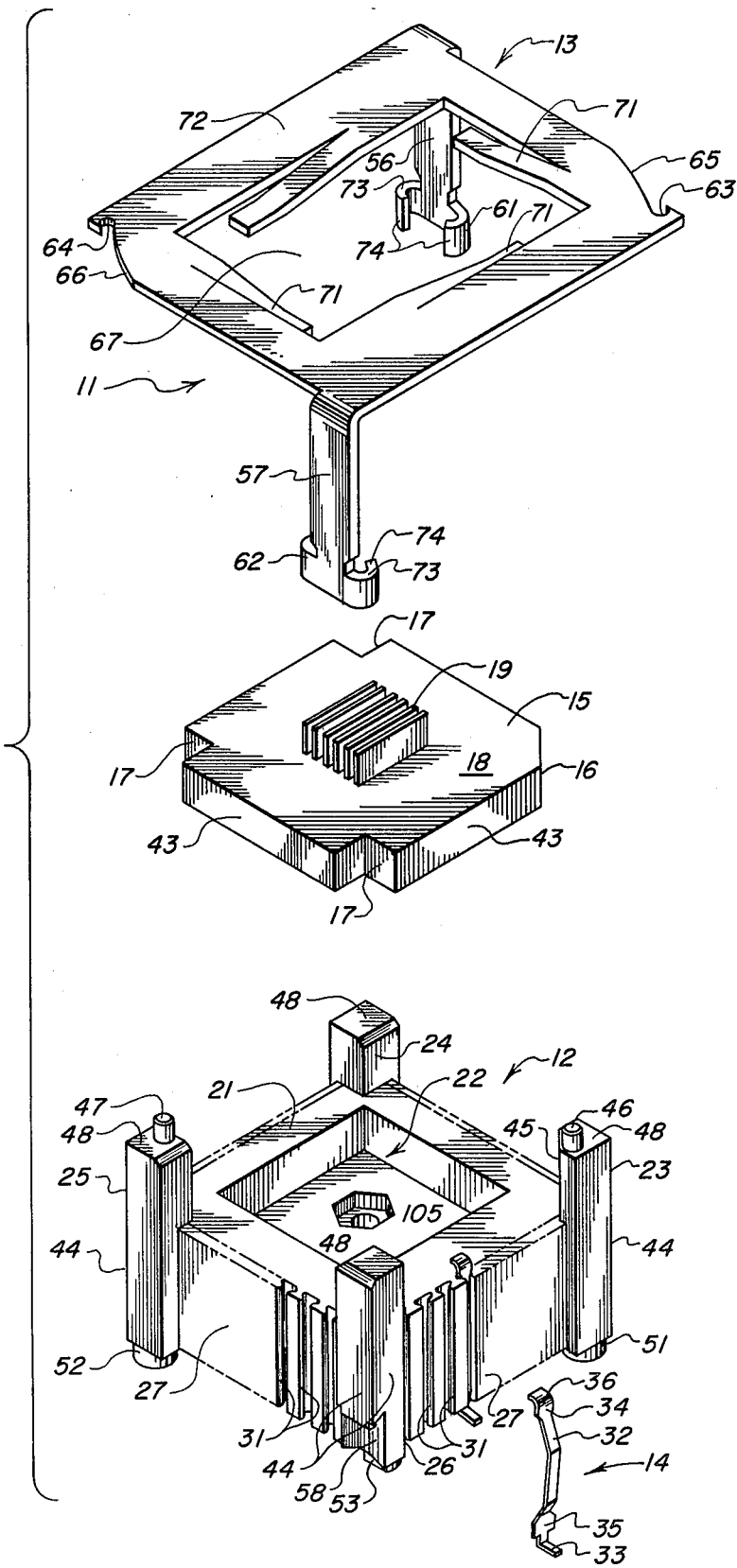
FIG. 4 is an exploded perspective view of the carrier socket of the invention showing the relative position of the substrate and a contact element.
Figure 5:
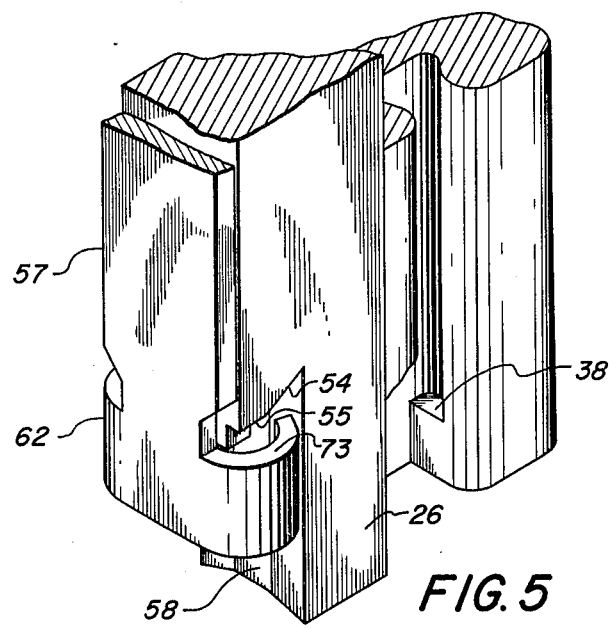
FIG. 5 is an enlarged fragmented perspective view of the corner engaging structure.

With reference now to the drawing, and more specifically to FIGS. 1, 4 and 5 thereof, there is shown a carrier socket 11 of the present invention. This socket is comprised of base 12, cover 13 and contact elements 14. Substrate 15, on which is mounted the integrated circuit chip, is positioned on the base by its corner posts and is held in that position by the cover. Typically, substrate 15 is formed of ceramic material and the chip is mounted to the bottom surface so that it does not appear in the drawing. The electrically conductive contact pads on the substrate are also located on the bottom surface in conventional manner and do not appear in the drawing. Some configurations of substrates have contact pads on the top surfaces also, and some are on the thin edge. The substrate is formed with beveled corner 16 for polarity and notched corners 17. A heat sink or heat dissipator 19 is often mounted to the top surface of the substrate. The particular configuration of this structure is not important, and may vary considerably with different manufacturers.

Figure 2:
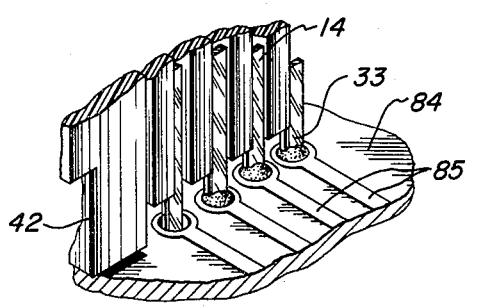
FIG. 2 is an enlarged partial perspective view showing the carrier socket of the invention with the contact elements extending through holes in the circuit board and soldered thereto.

The base is formed with rectangular bearing surface 21 having a central depression 22 and four corner posts 23, 24, 25 and 26. The exterior side walls 27 below bearing surface 21 are formed with a plurality of dovetail slots 31, each adapted to receive a contact element 14 therein. Elongated body portion 32 and bottom tang 33 of the contact element are relatively narrow while upper spade 34 and the barb 35 located between body portion 32 and tang 33 are substantially wider than the body and tang. A contact element is inserted into a slot 31 initially such that barb 35 makes interference contact with the wider interior portion of the slot. The contact element is then pulled downwardly causing a deformation and cold flow of the plastic material of base 12 until barb 35 makes contact with shoulder 38 (FIG. 5) located near the bottom of the slot. When the contact element is seated with barb 35 resting on shoulder 38, heat portion 36 of spade 34 resides a short distance, approximately 0.01 inch (0.254 mm), above bearing surface 21. While spade 34 is wider than body portion 32, it is narrower than barb 35 and narrower than the widest portion of slot 31, so that it is not confined in a restrictive manner at the top of the slot. Because of cold flow around barb 35, when the contact member comes to rest upon insertion, it is very firmly and positively retained in the slot in base 12. Tang 33 extends below the bottom of slot 31, either to contact a pad 41 on a circuit board as shown in FIG. 1, to extend into holes 42 arranged in a line in a circuit board as shown in FIG. 2, or to extend into staggered holes 40 in the alternative arrangement of FIG. 3. Other arrangements for connecting the contact members to the circuit board may be equally possible.

The contact member has a central bowed configuration, shown exaggerated in FIG. 4, to provide added resiliency of the spade in making contact with the substrate. When the substrate is pressed downwardly onto heat portions 36 of contacts 14, the heat portions deform slightly and the contacts bow outwardly as permitted by their preformed configuration and within the restrictions of slots 31. Bowing is permitted without changing overall longitudinal position of the contact because of the positive manner in which the barb 35 retains the contact in position. Slots 31 taper to a smaller width in the outward direction, thereby allowing some motion of the bowed central portions of the contacts 14. The resiliency thus constructed into the contact member accounts for tolerances between the plurality of contacts mounted in the base and for any unevenness on the substrate surface. Surface 21 serves as a positive stop for downward motion of portion 36 of the contact member, providing an antioverstress feature for the contact.

Corners 17 of substrate 15 are configured to engage corner posts 24, 25 and 26 of base 12 and the depth of corners 17 is substantially equal to the width or thickness of each corner post so that edge surface 43 of the substrate will be substantially coplanar with outer surfaces 44 of each corner post. Beveled corner 16 of the substrate is adapted to mate with beveled surface 45 of corner post 23 to provide proper electrical polarity of the substrate and its accompanying integrated circuit chip. It should be noted that the contact pads on the bottom surface (not shown) of the substrate normally extend out to the edge of the substrate, having sufficient length inwardly from the edge to make contact with bent portions 36 of the contact members. The chip is located on the bottom of the substrate and is accommodated in base 12 by depression 22.

Corner posts 23 and 25 of the base are formed with pegs 46 and 47 respectively, while the opposite ends of these corner posts are formed with standoffs 51 and 52 which normally reside either on the surface of the circuit board to which the carrier socket is mounted or may be accommodated in registration holes in the circuit board. Corner post 26 is formed with a rectangular bottom standoff 53, as is corner post 24, but this latter standoff does not appear in the drawing. Corner post 26 is also formed with a downward facing groove 54 located inwardly from ridge 55 adjacent outer surface 44, the ridge projecting downwardly from the level of groove 54. Corner post 24 is formed in a similar manner. That portion 58 of corner post 26 which is below groove 54, and is of smaller cross section than the upper part of the post, has a wide V-shaped surface facing outwardly. The purpose of this configuration will be explained hereinbelow.

Cover 13 is made of a relatively rigid but resilient material, preferably a metal, and has two downwardly projecting corner extensions 56 and 57 with ridge engaging lugs 61 and 62 respectively at the bottom terminations of these extensions. At the opposite corners of the cover, arcuate notches 63 and 64 are formed together with tapered arcuate entryways 65 and 66, respectively, for each of the notches. A central opening 67 is formed in the cover to accommodate heat sink 19 on the substrate. Four leaf spring elements 71 project downwardly from the top surface 72 of the cover adjacent opening 67.

In assembling the substrate and the cover to the base and contact element combination, the substrate is placed between the corners of base 12, resting upon resilient bent portions 36 of the contacts. Cover 13 is then placed upon the base, rotated slightly clockwise (as viewed from the top in FIG. 1) out of registration with the base. The cover, leaf springs 71 first, makes contact with the top surface 18 of substrate 15, and then upon further depression, approaches the top surfaces 48 of the corner posts. At this point in assembly, downward extensions 56 and 57 of the cover overlie external surfaces 44 of corner posts 24 and 26, also somewhat out of alignment. When in appropriate orientation, in the desired misaligned position, the cover is pressed further downwardly, somewhat deforming leaf springs 71 and at the same time forcing the substrate 15 downwardly for positive engagement with the contact elements. When the bottom surface of cover 13 engages the top surfaces 48 of the corner posts, the cover is rotated slightly counterclockwise so that notches 63 and 64 engage lugs 46 and 47 on respective corner posts 23 and 25. While the cover is still in a pressed downward position, engaging lugs 61 and 62 are slightly below shoulder 54 and ridge 55 on corner posts 24 and 26. When the cover is released, leaf springs 71 will force it upwardly as far as permitted by the upper surfaces 73 of engaging lugs 61 and 62 as they make contact with grooves 54 of the respective corner posts. Ends 74 of lugs 61, 62 are folded around inwardly toward each other at an angle with respect to the surface plane 44 of the corner posts. For this reason, lower end 58 of posts 26 has the V-shape previously discussed, that is, so that the angle of lug ends 74 can be accommodated when the lug engages groove 54 and partially encircles ridge 55. It should be noted how easily the cover and substrate may be removed from the base by merely reversing the steps enumerated above. It should also be appreciated that the cover, while easily assembled or removed from the base, facilitates positive engagement of the contact pads of substrate 15 with the upper portions 36 of contact elements 14.

As shown in FIG. 1, a portion of a circuit board 81 is formed with a plurality of printed circuit paths 82 extending outwardly from a rectangular array of pads 41. Contact tangs 33, which are bent outwardly as shown in FIG. 4, make contact with and are soldered or welded to pads 41 as shown in FIG. 1. These contact pads may be formed for planar welding and this is indicated by wires 83 welded between two or more such contact pads.

In an alternative embodiment, tang 33 is not bent outward as shown in FIGS. 1 and 4 but extends directly downward in line with the longitudinal direction of the contact element and extends through holes 42 in circuit board 84 as shown in FIG. 2. Similar printed circuit paths 85 are provided on board 84. When the carrier socket is placed in position on board 84, unbent tangs 33 of contact elements 14 are soldered to holes 42. Similarly, in FIG. 3 alternating tangs 86 of contact elements 14 are bent while the others are straight, in order to allow 0.100 inch (2.54 mm) spacing between adjacent holes, the parallel rows being 0.050 inch (1.27 mm) apart.

Figure 3:
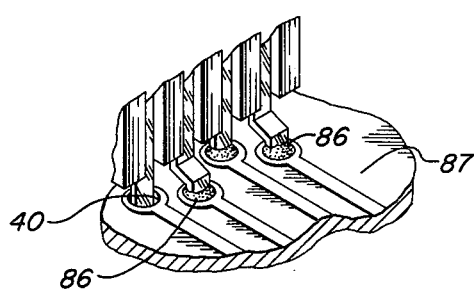
FIG. 3 is an enlarged partial perspective view similar to FIG. 2 showing alternative arrangement of the contacts for soldering.

It should be noted that not every hole or every pad on the boards as shown in FIGS. 1-3 would necessarily have a circuit path extending therefrom on the visible surface. It is possible that the holes 42 in boards 84 and 87 may be plated-through and this would normally be expected when the contact elements are soldered in the manner shown. There could be circuit traces on one or both sides of the board. Also the board could have more than two conductive layers.

When assembling the contact elements and the base, it would normally be expected that the contacts would be formed on a continuous strip and mounted to the base while they are still attached in spaced apart relationship to the strip. The bottom tang would be straight and the contact would be connected to the strip by means of the tang. In this case, the bottom tang would be much longer than shown in the drawing, the distance between barb 35 and the continuous strip being somewhat greater than the length of slots 31. An appropriate length containing several contacts would then be severed from the continuous strip and placed so that the narrower tang portions would slide into the slots and then the strip would be pulled downwardly until the bottom edges of barbs 35 engage the top surface of shoulders 38. The contact strip would then be separated from the contact element and the tang bent as shown in either FIG. 1 or FIG. 3 if desired.

Figure 6:
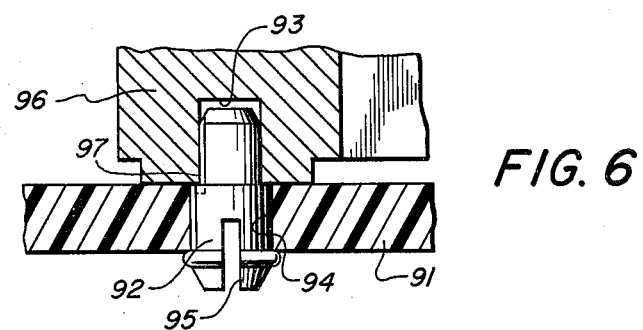
FIG. 6 is an enlarged fragmentary sectional view showing alternative means for mounting the carrier socket to a circuit board.

There are several options for mounting the socket of this invention to an interconnection board. The structure of FIGS. 1-4 discloses standoffs 51, 52 and 53 which rest on the board surface and the contact tangs are normally wave soldered to the pads 41 or in holes 40, 42. FIG. 6 shows a plastic stud mounting option. Stud 92 is mounted in hole 94 in board 91. The stud is formed with slot 95 to create a spring-like structure. A hole 93 in the base of corner post 96 receives the upper portion of stud 92. For keying purposes, a different size stud may be used on opposite corners. This arrangement provides both orientation for electrical purposes and antirotation means prior to soldering. Note that a relief slot 97 is provided in stud 92 so that air within hole 93 can escape when the stud is inserted.

Figure 7:
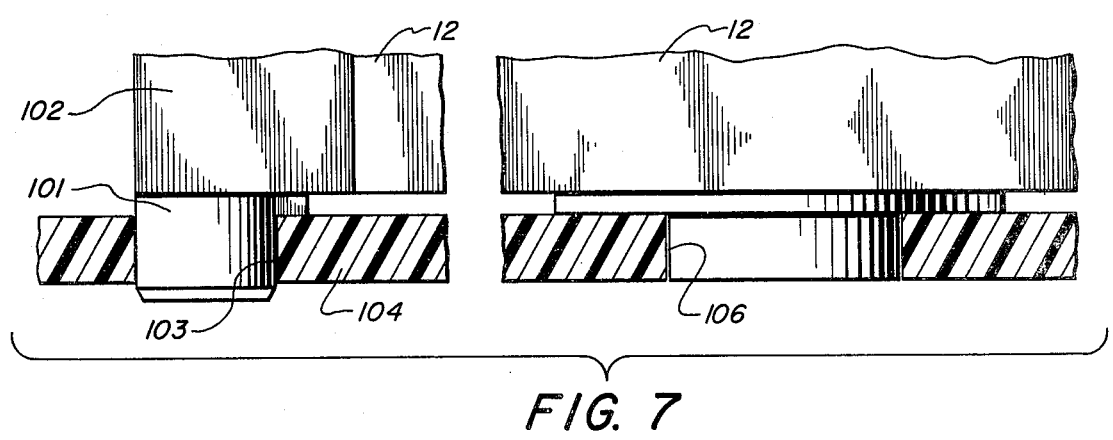
FIG. 7 is an enlarged fragmentary sectional view similar to FIG. 6 showing another alternative mounting means.

A further mounting option is shown in FIG. 7. In this version, one corner is formed with a stud 101 extending from corner post 102 which fits in hole 103 in board 104. This option also includes a center extension 106 in a mating hole in board 104, the extension having a central opening to accommodate a bolt (not shown), with the nut residing in hexagonal shaped opening 105 in the center of recess 22 as shown in FIG. 4. Thus the combination of center extension and corner stud take care of orientation and anti-rotation aspects of mounting the socket to the board, and the bolt serves to fix the socket on the board.

For information purposes, the materials and dimensions will be specified for a typical device made in accordance with the invention. The cover is preferably made of spring steel while the base is made of a suitable plastic material which behaves as described, that is, it is relatively rigid but has the property of cold flow as desired upon insertion of the contact elements. The contact elements themselves are beryllium copper with the upper spade being gold plated, the central body portion has a base nickel plating, while the barb and tang are tin-lead coated for soldering purposes.

In light of the above description it is likely that modifications and improvements will occur to those skilled in this art which are within the scope of the invention.

What is claimed is:

1. A carrier socket for a leadless chip integrated circuit having a predetermined exterior dimension, said socket comprising:
   a generally rectangular base formed with upright corner posts having flat right angled outer walls which have flat surfaces, the flat surfaces on opposed posts defining a plane, said base having side walls extending between said posts, said side walls having outer surfaces, there being a plurality of longitudinal slots in said outer surfaces, said slots being opened outwardly and exposed at the outer surfaces of said walls, said base having an outer dimension defined by the planes which include the flat surfaces of said corner posts, said outer dimension substantially matching the exterior dimension of said integrated circuit, thereby to enable the edges of said circuit to extend out to the exterior dimension of said base;
   a plurality of contact members, one said contact member residing in each of at least some of said slots; and
   a cover member extending between said corner posts and being substantially coextensive with said base member, said cover member removably engaging said base member.

2. The carrier socket recited in claim 1 wherein said cover member is formed with a substantially open central portion and a plurality of downwardly projecting tabs acting as leaf springs, said leaf springs being adapted to engage a surface parallel with and below said cover member.

3. The carrier socket recited in claim 2 wherein:
   at least two of said corner posts are formed with lug engaging means;
   said cover member further comprises:
   a downwardly projecting corner extension on at least two opposite corners; and
   lug means at the distal ends of each said corner extension, said lug means engaging one of said lug engaging means to retain said cover member on said base.

4. The carrier socket recited in claim 3 wherein:
   said lug engaging means comprises a downwardly projecting ridge; and
   each said lug means is formed with tabs bent toward each other to substantially surround said ridge.

5. The carrier socket recited in claim 4 wherein said each of said at least two corner posts are formed with a relief groove positioned inwardly from said ridge, the top surface of said tabs engaging said groove surface behind said ridge.

6. The carrier socket recited in claim 4 wherein:
at least one of said corner posts has an upwardly projecting peg which is substantially smaller in cross section than said corner post; and
said cover is formed with at least one notch engaging said peg when said lug means engage said ridges.

7. The carrier socket recited in claim 1 wherein:
each said longitudinal slot extends the entire width of said side walls; and
each said contact member is formed with a bottom tang projecting below said side wall and a top spade extending beyond the upper end of said slot.

8. The carrier socket recited in claim 7 wherein:
said side walls are formed with a planar top bearing surface coincident with the upper end of said slot; and
said socket is formed with a depression located inwardly and centrally of said side walls, said depression being below said bearing surface.

9. The carrier socket recited in claim 7 wherein said contact member is formed with a barb intermediate said spade and said tang, said barb being in interference fit with said slot.

10. The carrier socket recited in claim 9 wherein each said slot is formed with an upwardly facing shoulder adjacent the bottom end of said slot, said shoulder providing a positive stop for said barb.

11. The carrier socket recited in claim 7 or 10 wherein said contact member is preformed with an outward deflection to provide said contact member with longitudinal resiliency.

12. The carrier socket recited in claim 11 wherein said top spade is bent inwardly toward said side wall of said base to provide said contact member with additional longitudinal resiliency.

13. The carrier socket recited in claim 7 wherein said tang extends downwardly, adapted to be soldered below said carrier socket.

14. The carrier socket recited in claim 7 wherein said tang extends outwardly from the bottom of said slot, said tang being adapted to be connected to surfaces substantially coplanar with the bottom of said carrier socket.

15. The carrier socket recited in claim 1 or 2 wherein said carrier socket is adapted to retain a leadless substrate for an integrated circuit chip, said substrate being formed with a plurality of electrical contact pads on one surface thereof, said substrate residing on top of said side walls between said corner posts with at least some of said contact pads being in physical contact with one of said contact members.

16. The carrier socket recited in claim 15 wherein said cover member is adapted to bear against the opposite surface of said substrate and removably and resiliently retain said substrate in place on said base.

17. The carrier socket recited in claim 15 wherein said leaf springs are adapted to bear against the opposite surface of said substrate and resiliently retain said substrate on said base with said contact pads in engagement with said contact elements.

18. The carrier socket recited in claim 15 wherein:
said side walls are formed with a planar top bearing surface coincident with the upper end of said slot;
said socket is formed with a depression located inwardly and centrally of said side walls, said depression being below said bearing surface; and
said one surface of said substrate is adapted to be adjacent said bearing surface and said integrated circuit chip resides in said depression.

* * * * *